(12) United States Patent
Fang

(10) Patent No.: US 11,681,279 B2
(45) Date of Patent: Jun. 20, 2023

(54) METHOD FOR ENHANCING THE SEMICONDUCTOR MANUFACTURING YIELD

(71) Applicant: ASML Netherlands B.V., AH Veldhoven (NL)

(72) Inventor: Wei Fang, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 64 days.

(21) Appl. No.: 16/326,172

(22) PCT Filed: Aug. 14, 2017

(86) PCT No.: PCT/EP2017/070567
§ 371 (c)(1),
(2) Date: Feb. 15, 2019

(87) PCT Pub. No.: WO2018/033511
PCT Pub. Date: Feb. 22, 2018

(65) Prior Publication Data
US 2019/0187670 A1 Jun. 20, 2019

Related U.S. Application Data

(60) Provisional application No. 62/543,242, filed on Aug. 9, 2017, provisional application No. 62/375,257, filed on Aug. 15, 2016.

(51) Int. Cl.
*G05B 19/418* (2006.01)

(52) U.S. Cl.
CPC ... *G05B 19/41875* (2013.01); *G05B 19/4183* (2013.01); *G05B 2219/32193* (2013.01);
(Continued)

(58) Field of Classification Search
CPC .......... G05B 19/4183; G05B 19/41875; G05B 2219/32193; G05B 2219/37224;
(Continued)

(56) References Cited

U.S. PATENT DOCUMENTS

2001/0011706 A1* 8/2001 Nara .................. G03F 7/7065
250/397
2012/0314054 A1* 12/2012 Chou ............... G05B 19/41875
348/87
(Continued)

FOREIGN PATENT DOCUMENTS

| CN | 102253595 A | 11/2011 |
| CN | 103034067 A | 4/2013 |

(Continued)

OTHER PUBLICATIONS

Korean Industrial Property Tribunal decision denying patent dated Mar. 14, 2022. (Year: 2022).*

(Continued)

*Primary Examiner* — Chad G Erdman
(74) *Attorney, Agent, or Firm* — Finnegan, Henderson, Farabow, Garrett & Dunner, LLP

(57) ABSTRACT

Embodiments of the present disclosure provide systems and methods for enhancing the semiconductor manufacturing yield. Embodiments of the present disclosure provide a yield improvement system. The system comprises a training tool configured to generate training data based on receipt of one or more verified results of an inspection of a first substrate. The system also comprises a point determination tool configured to determine one or more regions on a second substrate to inspect based on the training data, weak point information for the second substrate, and an exposure recipe for a scanner of the second substrate.

17 Claims, 8 Drawing Sheets

(52) U.S. Cl.
CPC .............. *G05B 2219/37224* (2013.01); *G05B 2219/37448* (2013.01); *Y02P 90/02* (2015.11)

(58) Field of Classification Search
CPC ........... G05B 2219/37448; Y02P 90/14; Y02P 90/18; Y02P 90/20; Y02P 90/22
See application file for complete search history.

(56) References Cited

U.S. PATENT DOCUMENTS

| | | | | |
|---|---|---|---|---|
| 2015/0356233 | A1* | 12/2015 | Fouquet | G06F 30/398 716/112 |
| 2017/0193400 | A1* | 7/2017 | Bhaskar | G06N 3/0454 |
| 2018/0218090 | A1* | 8/2018 | Liu | G06F 30/398 |
| 2018/0218492 | A1* | 8/2018 | Zhang | G06T 7/0006 |
| 2018/0232873 | A1* | 8/2018 | Inoue | G06T 7/001 |
| 2019/0004504 | A1* | 1/2019 | Yati | G05B 19/41875 |

FOREIGN PATENT DOCUMENTS

| | | | | |
|---|---|---|---|---|
| CN | 103186657 | A | 7/2013 | |
| CN | 104124181 | A | 10/2014 | |
| CN | 105849643 | A | 8/2016 | |
| JP | 2006-210931 | A | 8/2006 | |
| JP | 2010514226 | A | 4/2010 | |
| JP | 2011040661 | A | 2/2011 | |
| JP | 2013074294 | A | 4/2013 | |
| JP | 2013168498 | A * | 8/2013 | ............ H01L 21/66 |
| KR | 20170015500 | A | 2/2017 | |
| TW | 201329760 | A1 | 7/2013 | |
| WO | WO 2008/077100 | A2 | 6/2008 | |
| WO | WO 2009/105785 | A1 | 8/2009 | |
| WO | WO-2015189026 | A2 * | 12/2015 | ............ G03F 7/705 |

OTHER PUBLICATIONS

Office Action and Search Report issued from the Intellectual Property Office of ROC Taiwan Patent Application No. 106127561 dated Jun. 4, 2018.

International Search Report and Written Opinion dated Nov. 27, 2017, for corresponding PCT International Application No. PCT/EP2017/070567.

Notification of Reason(s) for Refusal issued by the Korean Patent Office in corresponding Korean Patent Application No. 10-2019-7007519 (8 pgs.).

Notice of Reasons for Rejection issued by the Japanese Patent Office in corresponding Japanese Patent Application No. 2019-506496, dated Jul. 13, 2020 (7 pgs.).

Search Reporting issued by the Japanese Patent Office in related JP Application No. 2019-506496; dated Apr. 6, 2020 (53 pgs.).

First Office Action issued by the Chinese Patent Office in related CN Application No. 2017-80049949.2; dated Feb. 2, 2021 (4 pgs.).

Office Action issued in related Israeli Patent Application No. 264656; dated Oct. 31, 2021 (7 pgs.).

* cited by examiner

METHOD FOR ENHANCING THE SEMICONDUCTOR MANUFACTURING YIELD

CROSS-REFERENCE TO RELATED APPLICATIONS

This application is a national stage filing under 35 U.S.C. § 371 of International Application No. PCT/EP2017/070567, filed on Aug. 14, 2017, and published as WO 2018/033511 A1, which claims priority of U.S. application 62/375,257 which was filed on Aug. 15, 2016 and U.S. application 62/543,242 which was filed on Aug. 9, 2017. The contents of these applications are each incorporated herein by reference in their entirety.

TECHNICAL FIELD

The present disclosure generally relates to the field of semiconductor manufacturing, and more particularly, to systems and methods for enhancing the semiconductor manufacturing yield.

BACKGROUND

In manufacturing processes of integrated circuits (ICs), unfinished or finished circuit components are inspected to ensure that they are manufactured according to design and are free of defects. An inspection system utilizing an optical microscope can provide high throughput but typically has resolution down to a few hundred nanometers; and the resolution is limited by the wavelength of light. As the physical sizes of IC components continue to reduce down to a sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With an SEM, electrons of a single primary electron beam, or electrons of a plurality of primary electron beams, can be focused at probe spots of a wafer under inspection. The interactions of the primary electrons with the wafer can result in one or more secondary electron beams. The secondary electron beams may comprise backscattered electrons, secondary electrons, or Auger electrons, resulting from the interactions of the primary electrons with the wafer. The intensity of the one or more secondary electron beams can vary based on the properties of the internal and/or external structures of the wafer. However, the throughput of a charge particle beam microscope at high resolution can be significantly lower compared with a lower resolution optical microscope.

Different semiconductor manufacturing processes, for example, photo-resist coating, exposure, development, etch, and photo-resist removal (ashing) can be batch processes. Batch processing can cause non-uniformity in patterning of multiple substrates (also referred to herein as wafers) within a batch. Further, if defect inspection of patterned substrates is conducted after the entire patterning process is completed, the defective wafers may be scrapped or may have to be converted to a down-graded product. This can cause a significant reduction in semiconductor manufacturing yield.

SUMMARY

Embodiments of the present disclosure provide systems and methods for enhancing the semiconductor manufacturing yield. In some embodiments, a yield improvement system is provided. The system comprises a training tool configured to generate training data based on receipt of one or more verified results of an inspection of a first substrate. The system also comprises a point determination tool configured to determine one or more regions on a second substrate to inspect based on the training data, weak point information for the second substrate, and an exposure recipe for a scanner of the second substrate.

In some embodiments, a method for yield improvement is provided. The method comprises receiving one or more verified results of an inspection of a first substrate; and generating training data based on the received verified results. The method further comprises determining one or more regions on a second substrate to inspect based on the training data, weak point information for the second substrate, and an exposure recipe for a scanner of the second substrate.

In some embodiments, a non-transitory computer readable storage medium is provided. The medium stores instructions that are executable by a computing device, which includes one or more processors, causing the computing device to perform a method for yield improvement. The method comprises receiving one or more verified results of an inspection of a first substrate; and generating training data based on the received verified results. The method further comprises determining one or more regions on a second substrate to inspect based on the training data, weak point information for the second substrate, and an exposure recipe for a scanner of the second substrate.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present disclosure relates to systems and methods for enhancing the semiconductor manufacturing yield. A test wafer or a first wafer can be processed from exposure to development and an exposure recipe of a scanner, for example, a high density focus map (HDFM) can be recorded. Embodiments of the present disclosure provide a point determination tool that can be configured to determine one or more regions of the test wafer or the first wafer to inspect, based on the exposure recipe and hot spot information for the wafer. The exposure recipe for subsequent processed wafers can be optimized based on the inspection results of the test wafer or the first wafer. Embodiments of the present disclosure also provide a training tool that can be configured to generate training data based on the inspection results. The training data can be provided to the point determination tool to determine one or more regions of the subsequent processed wafers to inspect, based on the training data, exposure recipe, and hot spot information for the wafer. The disclosed systems and methods enable dynamic updates of the exposure recipe and the regions to be monitored. The updates to the exposure recipe can reduce defects in subsequent processed wafers and therefore improve the semiconductor manufacturing yield. The updates to monitoring may include monitoring fewer hot spots thereby improving the throughput. The updates to monitoring can also include a change in the monitoring to improve detection of defects. The improved defect detection can help in further improving the semiconductor manufacturing yield.

Figure 1:
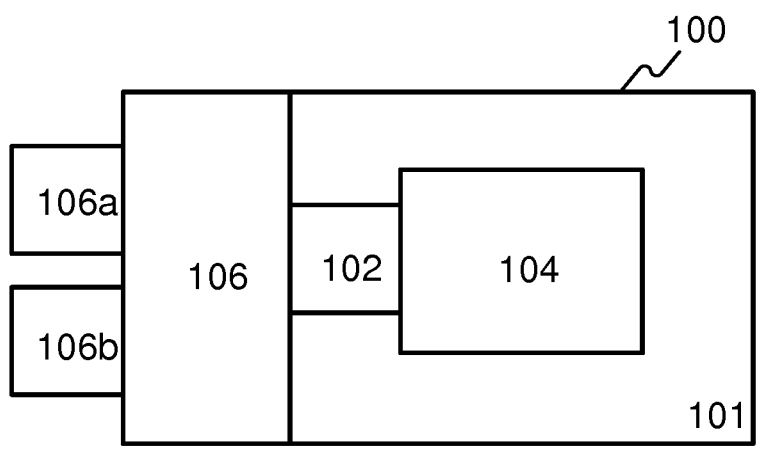
FIG. 1 is a schematic diagram illustrating an exemplary electron beam inspection system, consistent with embodiments of the present disclosure.

Reference is now made to FIG. 1, which illustrates an exemplary electron beam inspection (EBI) system 100 consistent with embodiments of the present disclosure. As shown in FIG. 1, EBI system 100 includes a main chamber 101, a load/lock chamber 102, an electron beam tool 104, and an equipment front end module (EFEM) 106. Electron beam tool 104 is located within main chamber 101.

EFEM 106 includes a first loading port 106a and a second loading port 106b. EFEM 106 may include additional loading port(s). First loading port 106a and second loading port 106b can receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 106 can transport the wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robot arms (not shown) can transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by electron beam tool 104.

Figure 2:
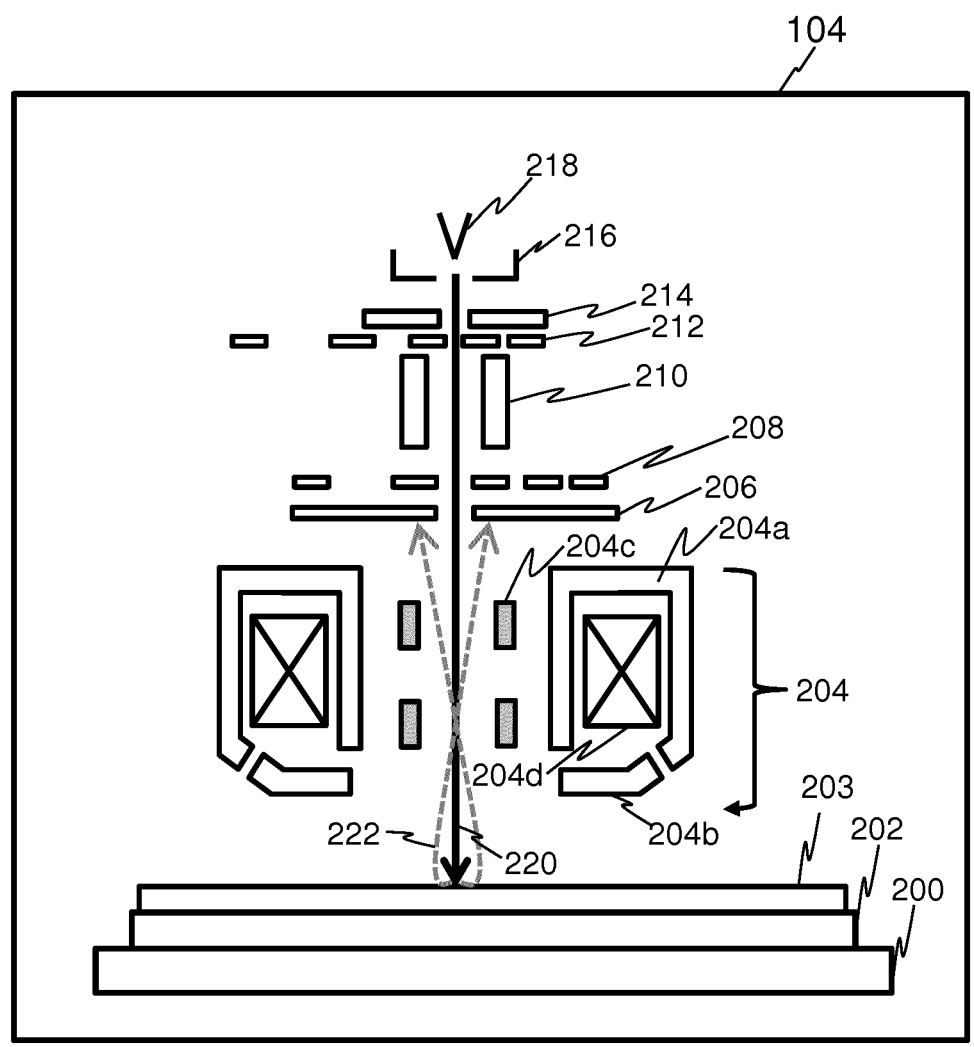
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates exemplary components of electron beam tool 104 consistent with embodiments of the present disclosure. As shown in FIG. 2, electron beam tool 104 includes a motorized stage 200, and a wafer holder 202 supported by motorized stage 200 to hold a wafer 203 to be inspected. Electron beam tool 104 further includes an objective lens assembly 204, electron detector 206, an objective aperture 208, a condenser lens 210, a beam limit aperture 212, a gun aperture 214, an anode 216, and a cathode 218. Objective lens assembly 204, in some embodiments, can include a modified swing objective retarding immersion lens (SORIL), which includes a pole piece 204a, a control electrode 204b, a deflector 204c, and an exciting coil 204d. Electron beam tool 104 may additionally include an energy dispersive X-ray spectrometer (EDS) detector (not shown) to characterize the materials on the wafer.

A primary electron beam 220 is emitted from cathode 218 by applying a voltage between anode 216 and cathode 218. Primary electron beam 220 passes through gun aperture 214 and beam limit aperture 212, both of which can determine the size of electron beam entering condenser lens 210, which resides below beam limit aperture 212. Condenser lens 210 focuses primary electron beam 220 before the beam enters objective aperture 208 to set the size of the electron beam before entering objective lens assembly 204. Deflector 204c deflects primary electron beam 220 to facilitate beam scanning on the wafer. For example, in a scanning process, deflector 204c can be controlled to deflect primary electron beam 220 sequentially onto different locations of top surface of wafer 203 at different time points, to provide data for image reconstruction for different parts of wafer 203. Further, in some embodiments, anode 216 and cathode 218 can be configured to generate multiple primary electron beams 220, and electron beam tool 104 can include a plurality of deflectors 204c to project the multiple primary electron beams 220 to different portions of the wafer at the same time, to provide data for image reconstruction for different portions of wafer 203.

Exciting coil 204d and pole piece 204a generate a magnetic field that begins at one end of pole piece 204a and terminates at the other end of pole piece 204a. A part of wafer 203 being scanned by primary electron beam 220 can be immersed in the magnetic field and can be electrically charged, which, in turn, creates an electric field. The electric field reduces the energy of impinging primary electron beam 220 near the surface of the wafer before it collides with the wafer. Control electrode 204b, being electrically isolated from pole piece 204a, controls an electric field on the wafer to prevent micro-arching of the wafer and to ensure proper beam focus.

A secondary electron beam 222 can be emitted from the part of wafer 203 upon receiving primary electron beam 220. Secondary electron beam 222 can form a beam spot on sensor surfaces of electron detector 206. Electron detector 206 can generate a signal (e.g., a voltage, a current, etc.) that represents an intensity of the beam spot, and provide the signal to a processing system (not shown in FIG. 2). The intensity of secondary electron beam 222, and the resultant beam spot, can vary according to the external and/or internal structure of wafer 203. Moreover, as discussed above, primary electron beam 220 can be projected onto different locations of the surface of the wafer, to generate secondary electron beams 222 (and the resultant beam spot) of different intensities. Therefore, by mapping the intensities of the beam spots with the locations of wafer 203, the processing system can reconstruct an image that reflects the internal and/or external structures of wafer 203.

Figure 3:
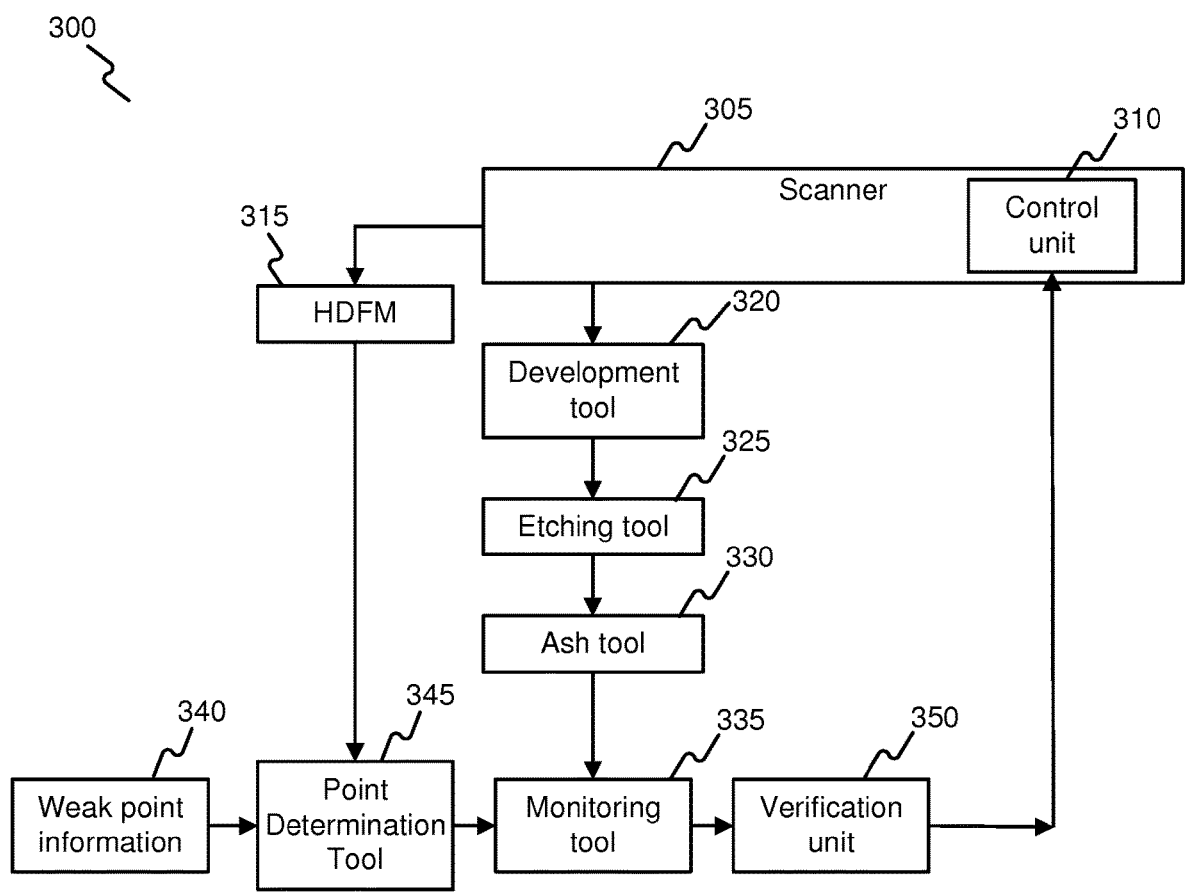
FIG. 3 is a schematic diagram illustrating a semiconductor processing system.

Reference is now made to FIG. 3, which is a schematic diagram illustrating a semiconductor processing system.

FIG. 3 illustrates a conventional semiconductor processing system 300 comprising a scanner 305, a development tool 320, an etching tool 325, an ash tool 330, a monitoring tool 335, a point determination tool 345, and a verification unit 350. Scanner 305 can comprise a control unit 310.

Scanner 305 can expose a wafer coated with photoresist to a circuit pattern to be transferred to the wafer. Control unit 310 can control an exposure recipe used to expose the wafer. Control unit 310 can adjust various exposure recipe parameters, for example, exposure time, source intensity, and exposure dose. An HDFM 315 can be recorded corresponding to the exposure.

Development tool 320 can develop the pattern on the exposed wafer by removing the photoresist from unwanted regions. For a positive photoresist, the portion of the photoresist that is exposed to light in scanner 305 becomes soluble to the photoresist developer and the unexposed portion of the photoresist remains insoluble to the photoresist developer. For a negative photoresist, the portion of the photoresist that is exposed to light in scanner 305 becomes insoluble to the photoresist developer and the unexposed portion of the photoresist remains soluble to the photoresist developer.

Etching tool 325 can transfer the pattern to one or more films under the photoresist by etching the films from portions of the wafer where the photoresist has been removed. Etching tool 325 can be a dry etch or wet etch tool. Ash tool 330 can remove the remaining photoresist from the etched wafer and the pattern transfer process to the film on the wafer can be completed.

Monitoring tool 335 can inspect the processed wafer at one or more locations on the wafer to generate monitor results. The monitor results can be based on spatial pattern determination, size measurement of different pattern features or a positional shift in different pattern features. The inspection locations can be determined by point determination tool 345.

Point determination tool 345 can comprise one or more pre-determined models to determine the inspection locations based on HDFM 315 and weak point information 340.

Weak point information 340 can include information regarding locations with a high probability of problems related to the patterning process. Weak point information 340 can be based on the transferred pattern, various process parameters and properties of the wafer, scanner 305, and etching tool 325.

Verification unit 350 can compare the monitor results from monitoring tool 335 with corresponding design parameters to generate verified results. Verification unit 350 can provide the verified results to control unit 310 of scanner 305. Control unit 310 can adjust the exposure recipe for subsequent wafers based on the verified results. For example, control unit may decrease exposure dose of scanner 305 for some locations on subsequent wafers based on the verified results.

Figure 4:
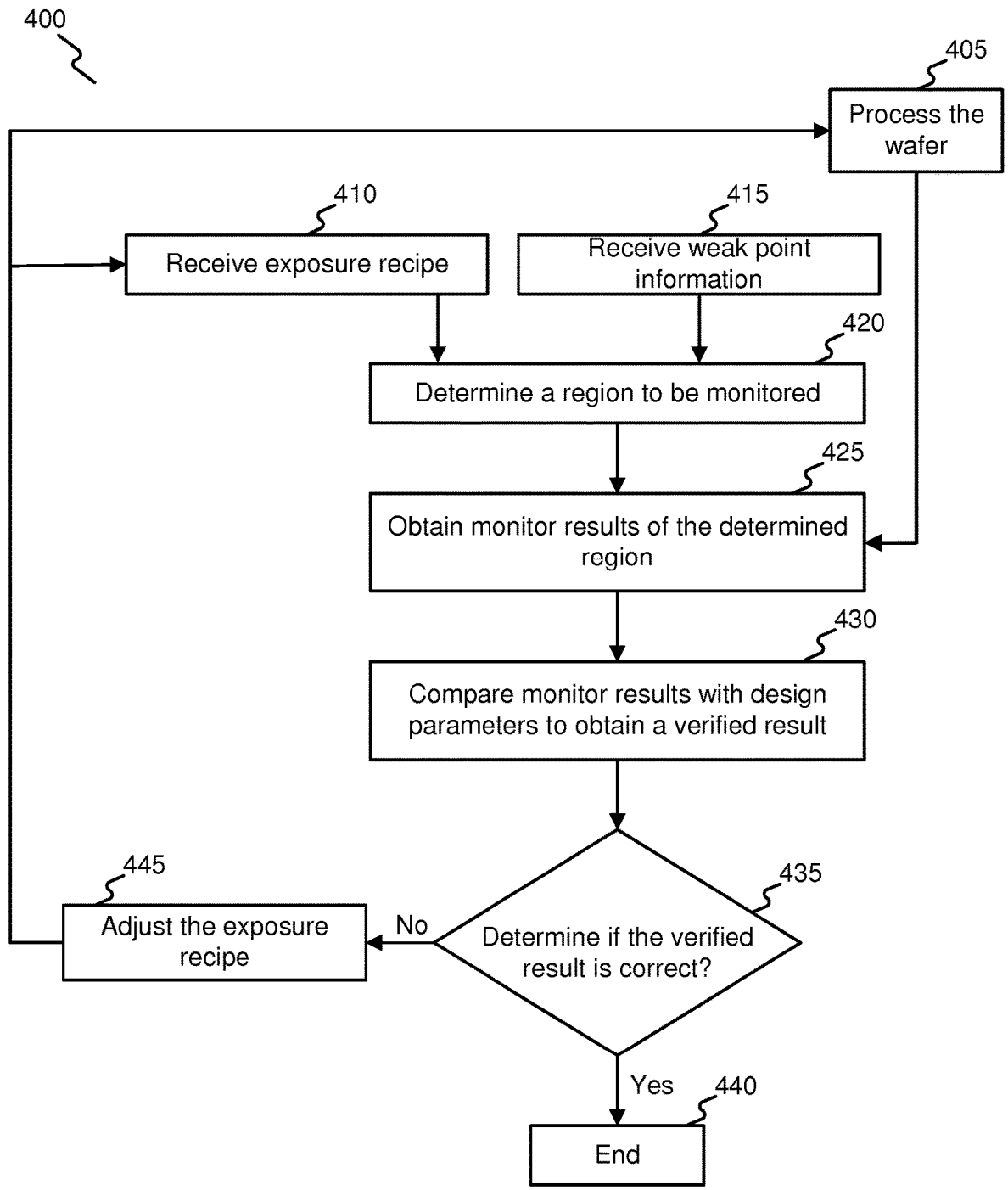
FIG. 4 is a flowchart illustrating a method for semiconductor processing.

Reference is now made to FIG. 4, which is a flowchart illustrating a conventional method for semiconductor processing. As an example, method 400 can be performed by conventional semiconductor processing system 300.

In step 405, semiconductor processing system 300 can process a wafer coated with photoresist to transfer a pattern onto the wafer. Scanner 305 can expose the wafer to the pattern. Control unit 310 can control an exposure recipe used to expose the wafer. Control unit 310 can adjust various exposure recipe parameters, for example, exposure time, source intensity and exposure dose. HDFM 315 can be recorded corresponding to the exposure. Development tool 320 can develop the pattern on the exposed wafer by removing the photoresist from unwanted regions. Etching tool 325 can transfer the pattern to one or more films under the photoresist by etching the films from portions of the wafer where the photoresist has been removed. Ash tool 330 can remove the remaining photoresist from the etched wafer and the pattern transfer process to the film on the wafer can be completed.

In step 410, point determination tool 345 can receive the exposure recipe corresponding to the patterning of the wafer in step 405. The exposure recipe can be provided by scanner 305.

In step 415, point determination tool 345 can receive weak point information 340 corresponding to the patterning process. Weak point information 340 can include information regarding locations with a high probability of problems related to the patterning process. Weak point information 340 can be based on the transferred pattern, various process parameters, and properties of the wafer, scanner 305, and etching tool 325.

In step 420, point determination tool 345 can determine regions of the patterned wafer to be monitored. Point determination tool 345 can use one or more pre-determined models to determine the inspection locations based on the exposure recipe received in step 410 and weak point information 340 received in step 415.

In step 425, monitoring tool 335 can inspect the regions of the patterned wafer determined to be monitored by point determination tool 345 in step 420. Monitoring tool 335 can inspect the patterned wafer at one or more locations to generate monitor results. The monitor results can be based on spatial pattern determination, size measurement of different pattern features or a positional shift in different pattern features.

In step 430, verification unit 350 can compare the monitor results from monitoring tool 335 with corresponding design parameters to generate verified results.

In step 435, verification unit 350 can determine if the verified results are correct according to design requirements. If the verified results are determined to be correct, verification unit 350 may take no further action for the corresponding wafer. If the verified results are determined to not be correct, verification unit 350 can provide the verified results to control unit 310 of scanner 305.

In step 445, control unit 310 can adjust the exposure recipe for subsequent wafers based on the verified results. For example, control unit 310 may decrease an exposure dose of scanner 305 for some locations on subsequent wafers based on the verified results.

In conventional method 400, point determination tool 345 uses a static model based on HDFM 315 and weak point information 340 to determine regions to be monitored. The model is not dynamically updated based on the verified results of previous wafers. For example, the verified results for some weak point locations may be correct for multiple monitored wafers. So throughput can be improved by not monitoring these weak point locations. But in conventional method 400, point determination tool 345 cannot use the verified results of previous wafers to determine monitor locations for subsequent wafers. So the throughput is not improved. Further, control unit 310 may adjust the exposure recipe based on the verified results but the model is not dynamically updated in response to the updated exposure recipe. For example, based on the updated exposure recipe, a different weak point location may need to be monitored. Further, an update may be needed in recipe of monitoring tool 335 to detect issues for wafers processed with the updated exposure recipe. But in conventional method 400, point determination tool 345 cannot make updates to the monitor locations and recipe based on updates in the exposure recipe. The inability to make updates can reduce the detection efficiency of patterning problems in conventional method 400.

Figure 5:
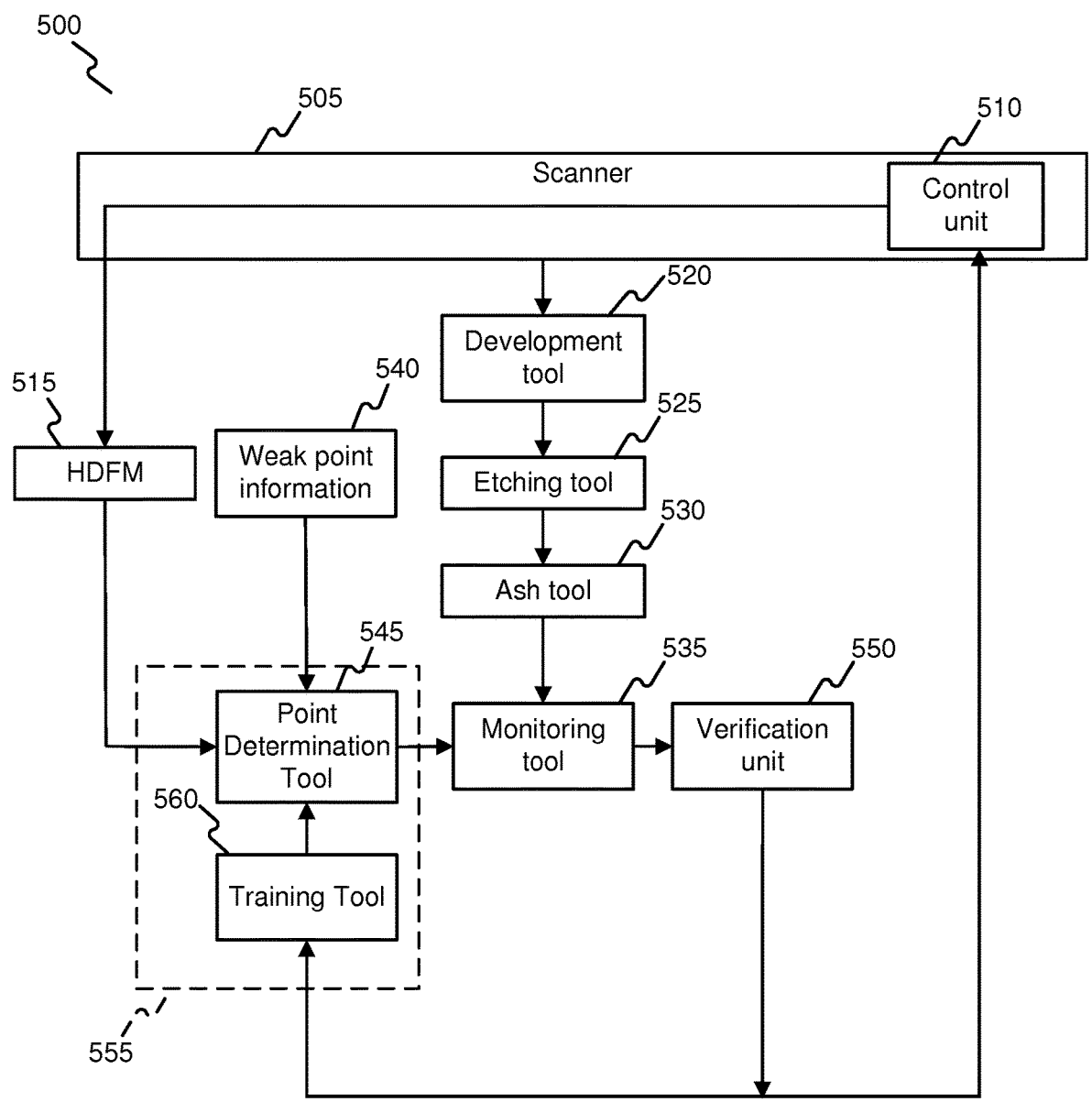
FIG. 5 is a schematic diagram illustrating an exemplary yield improvement system, consistent with embodiments of the present disclosure.

Reference is now made to FIG. 5, which is a schematic diagram illustrating an exemplary processing system 500, consistent with embodiments of the present disclosure. Semiconductor processing system 500 can include a scanner 505, a control unit 510, a development tool 520, an etching tool 525, an ash tool 530, a monitoring tool 535, a verification unit 550, and a yield improvement system 555. Yield improvement system 555 can comprise a point determination tool 545 and a training tool 560.

Point determination tool 545 and training tool 560 may each include one or more modules. In general, the word "module," as used herein, can be a packaged functional hardware unit designed for use with other components (e.g., portions of an integrated circuit) or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedded in firmware, such as an erasable programmable read-only memory (EPROM). It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

In some embodiments, point determination tool 545 and training tool 560 can be combined in a single tool. In some embodiments, yield improvement system 555 may be included within monitoring tool 535.

Scanner 505 can expose a wafer coated with photoresist to a circuit pattern to be transferred to the wafer. Control unit 510 can control an exposure recipe used to expose the wafer. Control unit 510 can adjust various exposure recipe parameters, for example, exposure time, source intensity, and exposure dose. An HDFM 515 can be recorded corresponding to the exposure.

Development tool 520 can develop the pattern on the exposed wafer by removing the photoresist from unwanted regions. For a positive photoresist, the portion of the photoresist that is exposed to light in scanner 505 becomes soluble to the photoresist developer and the unexposed portion of the photoresist remains insoluble to the photoresist developer. For a negative photoresist, the portion of the photoresist that is exposed to light in scanner 505 becomes insoluble to the photoresist developer and the unexposed portion of the photoresist remains soluble to the photoresist developer.

Etching tool 525 can transfer the pattern to one or more films under the photoresist by etching the films from portions of the wafer where the photoresist has been removed. Etching tool 525 can be a dry etch or wet etch tool. Ash tool 530 can remove the remaining photoresist from the etched wafer and the pattern transfer process to the film on the wafer can be completed.

Monitoring tool 535 can inspect the processed wafer at one or more locations on the wafer to generate monitor results. The monitor results can be based on spatial pattern determination, size measurement of different pattern features or a positional shift in different pattern features. The inspection locations can be determined by point determination tool 545 of yield improvement system 555. Point determination tool 545 can comprise one or more models to determine the inspection locations based on HDFM 515, weak point information 540 and training data provided by training tool 560. Point determination tool 545 may include one or more modules.

Weak point information 540 can include information regarding locations with a high probability of problems related to the patterning process. Weak point information 540 can be based on the transferred pattern, various process parameters and properties of the wafer, scanner 505, and etching tool 525.

Verification unit 550 can compare the monitor results from monitoring tool 535 with corresponding design parameters to generate verified results. Verification unit 550 can provide the verified results to control unit 510 of scanner 505. Control unit 510 can adjust the exposure recipe for subsequent wafers based on the verified results. For example, control unit 510 may decrease exposure dose of scanner 305 for some locations on subsequent wafers based on the verified results. Verification unit 550 can further provide the verified results to training tool 560 of yield improvement system 555.

Training tool 560 can generate training data based on the verified results received from verification unit 550. Training tool 560 can comprise a deep neural network to analyze the one or more verified results for generating the training data. In some embodiments, training tool 560 can also receive HDFM 515 and further generate training data based on HDFM 515. Training tool 560 can provide the generated training data to point determination tool 545. Point determination tool 545 can determine inspection points for other wafers based on the received training data, HDFM 515 and weak point information 540. The monitor points can therefore be dynamically selected instead of a fixed model.

Figure 6A:
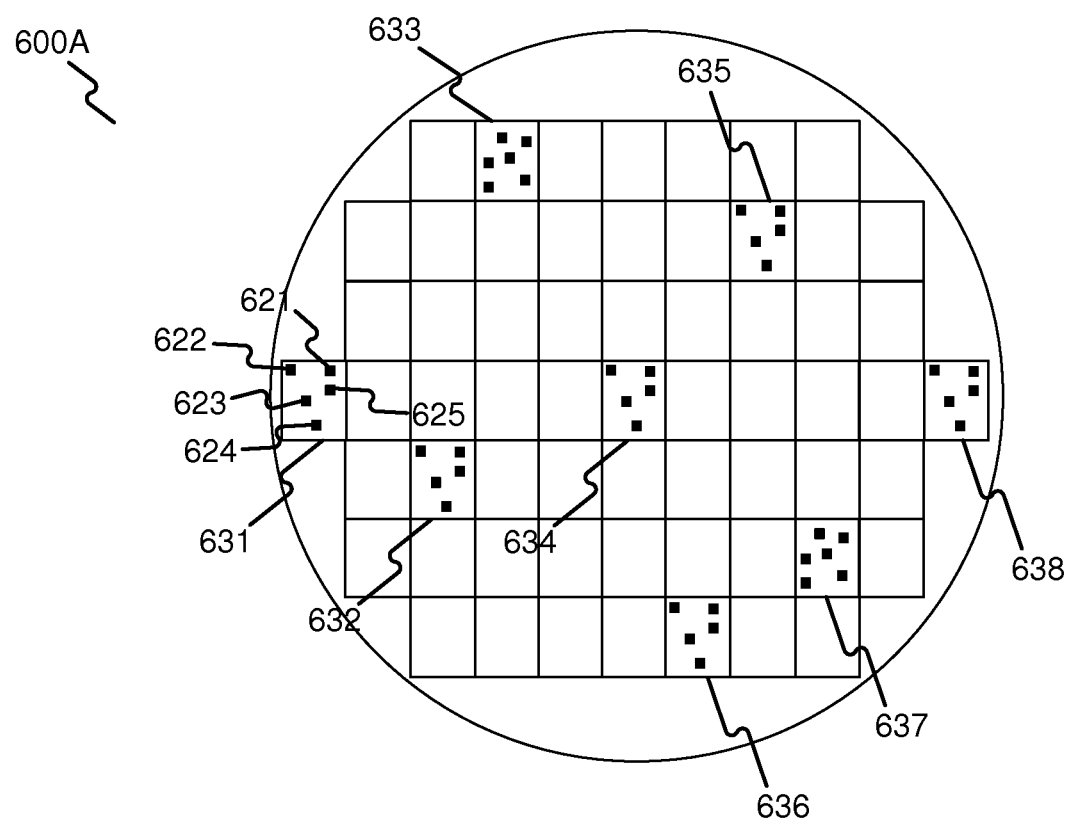
FIGS. 6A, 6B are schematic diagrams illustrating inspection regions on substrates, consistent with embodiments of the present disclosure.
Figure 6B:
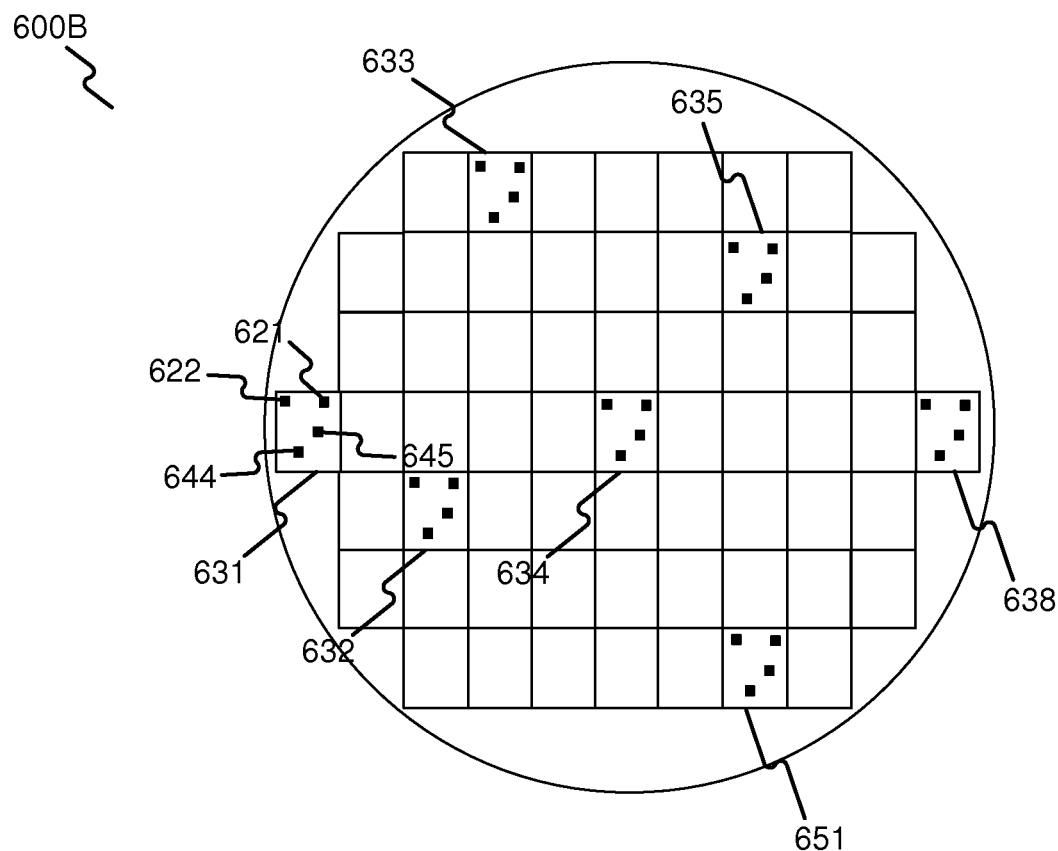

Reference is now made to FIG. 6A and FIG. 6B, which are schematic diagrams illustrating inspection regions on a first patterned substrate 600A and a second patterned substrate 600B respectively, consistent with embodiments of the present disclosure. Substrate 600A and substrate 600B may be processed by a semiconductor processing system having yield improvement system 555, e.g. semiconductor processing system 500 of FIG. 5.

A point determination tool (e.g., point determination tool 545 of semiconductor processing system 500) can determine inspection regions for substrate 600A. Based on an exposure recipe (e.g., HDFM 515) and weak point information (e.g., weak point information 540), the point determination tool can determine eight dies labelled 631, 632, 633, 634, 635, 636, 637, and 638 for inspection. Within each die, the point determination can determine five locations labelled 621, 622, 623, 624, and 625 for inspection.

A monitoring tool (e.g., monitoring tool 535 of semiconductor processing system 500) can perform inspection for the determined locations of substrate 600A. A verification unit (e.g., verification unit 550 of semiconductor processing system 500) can generate verified results by comparing the monitor results with design parameters. The verified results can be used to update the exposure recipe during processing of substrate 600B.

A training tool (e.g., training tool 560 of semiconductor processing system 500) can generate training data based on the verified results and provide it to the point determination tool. The point determination tool can use the training data determine regions for inspection for substrate 600B. For example, the point determination tool can reduce the number of dies to be inspected from eight to seven. As shown in FIG. 6B, point determination tool can inspect die 651 for substrate 600B instead of dies 636 and 637 for substrate 600A. In some embodiments, the point determination tool can also reduce the number of inspection points for each die, based on the received training data. Reduction in the number of inspection points can increase the throughput of the processing system. Further, the monitor points or monitor recipe can be updated corresponding to updates in the exposure recipe used during processing of substrate 600B. For example, if a contact is formed by using the updated exposure recipe a different monitoring tool recipe (e.g., different landing energy or different beam current) can be used to capture different open/short defects for substrate 600B. The training data can include information to modify the monitoring tool recipe corresponding to updates in the exposure recipe. If there is no change in the monitoring tool recipe, the changed open/short defects may not be identified. Systems and methods provided by present disclosure can therefore improve detection of defects and thereby improve the semiconductor manufacturing yield.

Figure 7:
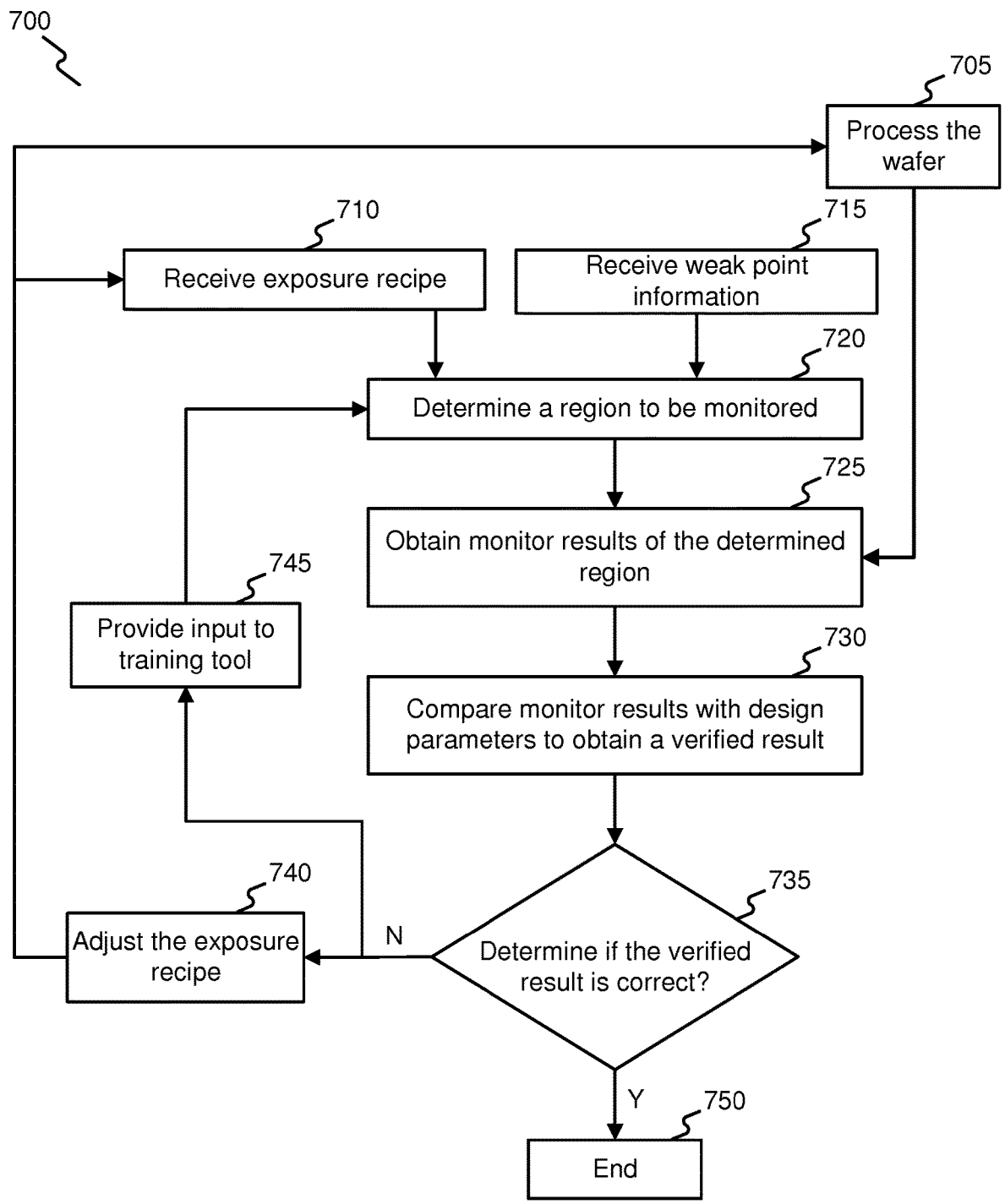
FIG. 7 is a flowchart illustrating an exemplary method for yield improvement, consistent with embodiments of the present disclosure.

Reference is now made to FIG. 7, which is a flowchart illustrating an exemplary method for yield improvement, consistent with embodiments of the present disclosure. As an example, method 700 can be performed by semiconductor processing system 500 comprising yield improvement system 555. It will be readily appreciated that the illustrated procedure can be altered to modify the order of steps, delete steps, or further include additional steps.

In step 705, the semiconductor processing system can process a wafer coated with photoresist to transfer a pattern onto the wafer. A scanner (e.g., scanner 505 of semiconductor processing system 500) can expose the wafer to the pattern. A control unit within the scanner (e.g., control unit 510 of semiconductor processing system 500) can control an exposure recipe used to expose the wafer. The control unit can adjust various exposure recipe parameters, for example, exposure time, source intensity, and exposure dose. An HDFM (e.g. HDFM 515 of semiconductor processing system 500) can be recorded corresponding to the exposure. A development tool (e.g., development tool 520 of semiconductor processing system 500) can develop the pattern on the exposed wafer by removing the photoresist from unwanted regions. An etching tool (e.g., etching tool 525 of semiconductor processing system 500) can transfer the pattern to one or more films under the photoresist by etching the films from portions of the wafer where the photoresist has been removed. An ashing tool (e.g., ash tool 530 of semiconductor processing system 500) can remove the remaining photoresist from the etched wafer and the pattern transfer process to the film on the wafer can be completed.

In step 710, a point determination tool (e.g., point determination tool 545 of semiconductor processing system 500) can receive the exposure recipe corresponding to the patterning of the wafer in step 705. The exposure recipe can be provided by the scanner.

In step 715, the point determination tool can receive the weak point information (e.g., weak point information 540 of semiconductor processing system 300) corresponding to the patterning process. The weak point information can include information regarding locations with a high probability of problems related to the patterning process. The weak point information can be based on the transferred pattern, various process parameters and properties of the wafer, the scanner, and the etching tool.

In step 720, the point determination tool can determine regions of the patterned wafer to be monitored. The point determination tool can use one or more pre-determined models to determine the inspection locations based on the exposure recipe received in step 710 and the weak point information received in step 715.

In step 725, a monitoring tool (e.g. monitoring tool 535 of semiconductor processing system 500) can inspect the regions of the patterned wafer determined to be monitored by the point determination tool in step 720. The monitoring tool can inspect the patterned wafer at one or more locations to generate monitor results. The monitor results can be based on spatial pattern determination, size measurement of different pattern features, or a positional shift in different pattern features.

In step 730, a verification unit (e.g., verification unit 550 of semiconductor processing system 500) can compare the monitor results from the monitoring tool with corresponding design parameters to generate verified results.

In step 735, the verification unit can determine if the verified results are correct according to design requirements. If the verified results are determined to be correct, the verification unit may take no further action for the corresponding wafer. If the verified results are determined to not be correct, the verification unit can provide the verified results to the control unit of the scanner and a training tool of the yield improvement system (e.g., training tool 560 of yield improvement system 555).

In step 740, the control unit can adjust the exposure recipe for subsequent wafers based on the verified results. For example, the control unit may decrease an exposure dose of the scanner for some locations on subsequent wafers based on the verified results.

In step 745, the training tool can receive the verified results from the verification unit and can generate training data based on the verified results. The training tool can comprise a deep neural network to analyze the one or more verified results for generating the training data. The training tool can provide the generated training data to the point determination tool. The point determination tool can determine inspection points for other wafers based on the received training data, the exposure recipe, and the weak point information. The monitor points can therefore be dynamically determined instead of being dependent on a fixed model. This dynamic determination can reduce defects in subsequent processed wafers and therefore improve the semiconductor manufacturing yield. Moreover, the updates to monitoring resulting from the dynamic determination may include monitoring fewer hot spots thereby improving the throughput. The updates to monitoring resulting from the dynamic determination can also include a change in the monitoring to improve detection of defects. The improved defect detection can help in further improving the semiconductor manufacturing yield.

The embodiments may further be described using the following clauses:

1. A yield improvement system comprising:
a training tool configured to generate training data based on receipt of one or more verified results of an inspection of a first substrate; and
a point determination tool configured to determine one or more regions on a second substrate to inspect based on the training data, weak point information for the second substrate, and an exposure recipe for a scanner of the second substrate.
2. The system of clause 1, wherein the training tool is configured to use a deep neural network to analyze the one or more verified results for generating the training data.
3. The system of clauses 1 or 2, wherein the training tool is further configured to generate the training data based on the exposure recipe.
4. The system of any one of claims 1 to 3, wherein the one or more verified results are generated by a verification unit, based on a comparison of one or more monitor results of the first substrate with one or more design parameters.
5. The system of clause 4, wherein the one or more monitor results are generated by a monitoring tool, based on at least one of a spatial pattern determination, a pattern size measurement and a pattern shift measurement.
6. The system of clauses 4 or 5, wherein the exposure recipe is determined based on the one or more monitor results.
7. The system of any one of clauses 1 to 6, wherein the exposure recipe comprises a high density focus map.
8. The system of any one of clauses 1 to 7, wherein the first substrate and the second substrate are processed by a scanner, a development tool, an etching tool and an ash tool.
9. A method comprising:
receiving one or more verified results of an inspection of a first substrate;
generating training data based on the received verified results; and
determining one or more regions on a second substrate to inspect based on the training data, weak point information for the second substrate, and an exposure recipe for a scanner of the second substrate.
10. The method of clause 9, wherein the generating training data comprises using a deep neural network to analyze the one or more verified results.
11. The method of clauses 9 or 10, wherein the generating training data is further based on the exposure recipe.
12. The method of any one of clauses 9 to 11, wherein the verified results are generated by a verification unit, based on a comparison of one or more monitor results of the first substrate with one or more design parameters.
13. The method of clause 12, wherein the one or more monitor results are generated by a monitoring tool, based on at least one of a spatial pattern determination, a pattern size measurement and a pattern shift measurement.
14. The method of clauses 12 or 13, wherein the exposure recipe is determined based on the one or more monitor results.
15. The method of any one of clauses 9 to 14, wherein the exposure recipe comprises a high density focus map.
16. The method of any one of clauses 9 to 15, wherein the first substrate and the second substrate are processed by a scanner, a development tool, an etching tool, and an ash tool.

17. A non-transitory computer readable storage medium storing instructions that are executable by a computing device that includes one or more processors to cause the computing device to perform a method comprising:
receiving one or more verified results of an inspection of a first substrate;
generating training data based on the received verified results;
determining one or more regions on a second substrate to inspect based on the training data, weak point information for the second substrate, and an exposure recipe for a scanner of the second substrate.
18. The medium of clause 17, wherein generating training data comprises using a deep neural network to analyze the one or more verified results.
19. The medium of clauses 17 or 18, wherein generating training data is further based on the exposure recipe.
20. The medium of any one of clauses 17 to 19, wherein the verified results are generated by a verification unit, based on a comparison of one or more monitor results of the first substrate with one or more design parameters.
21. The medium of clause 20, wherein the one or more monitor results are generated by a monitoring tool, based on at least one of a spatial pattern determination, a pattern size measurement and a pattern shift measurement.
22. The medium of clauses 20 or 21, wherein the exposure recipe is determined based on the one or more monitor results.
23. The medium of any one of clauses 17 to 22, wherein the exposure recipe comprises a high density focus map.
24. The medium of any one of clauses 17 to 23, wherein the first substrate and the second substrate are processed by a scanner, a development tool, an etching tool, and an ash tool.

It will be appreciated that the present invention is not limited to the exact construction that has been described above and illustrated in the accompanying drawings, and that various modifications and changes can be made without departing from the scope thereof. It is intended that the scope of the invention should only be limited by the appended claims.

What is claimed is:

1. A yield improvement system comprising:
a training tool configured to generate training data based on receipt of one or more verified results of an inspection of a first substrate; and
a point determination tool configured to determine one or more regions on the second substrate to be inspected, based on the training data, weak point information for a second substrate, and an exposure recipe for the second substrate, wherein the exposure recipe for the second substrate is an exposure recipe of a scanner to expose the second substrate to a pattern,
wherein the one or more verified results are generated based on a comparison of one or more monitored results of the first substrate with one or more design parameters, and wherein the one or more monitored results are generated based on at least one of a pattern size measurement and a pattern shift measurement.
2. The system of claim 1, wherein the training tool is configured to use a deep neural network to analyze the one or more verified results for generating the training data.
3. The system of claim 1, wherein the training tool is further configured to generate the training data based on the exposure recipe, and/or wherein the exposure recipe comprises a high density focus map.

4. The system of claim 1, wherein the first substrate and the second substrate are processed by a scanner, a development tool, an etching tool and an ash tool.

5. A method comprising:
   receiving one or more verified results of an inspection of a first substrate;
   generating training data based on the received verified results; and
   determining one or more regions on the second substrate to be inspected, based on the training data, weak point information for a second substrate, and an exposure recipe for the second substrate, wherein the exposure recipe for the second substrate is an exposure recipe of a scanner to expose the second substrate to a pattern,
   wherein the one or more verified results are generated based on a comparison of one or more monitored results of the first substrate with one or more design parameters, and wherein the one or more monitored results are generated based on at least one of a pattern size measurement and a pattern shift measurement.

6. The method of claim 5, wherein the generating training data comprises using a deep neural network to analyze the one or more verified results.

7. The method of claim 5, wherein the generating training data is further based on the exposure recipe.

8. The method of claim 5, wherein the exposure recipe comprises a high density focus map.

9. The method of claim 5, wherein the first substrate and the second substrate are processed by a scanner, a development tool, an etching tool and an ash tool.

10. A non-transitory computer readable storage medium storing instructions that are executable by a computing device that includes one or more processors to cause the computing device to perform a method comprising:
    receiving one or more verified results of an inspection of a first substrate;
    generating training data based on the received verified results;
    determining one or more regions on the second substrate to be inspected, based on the training data, weak point information for a second substrate, and an exposure recipe for the second substrate, wherein the exposure recipe for the second substrate is an exposure recipe of a scanner to expose the second substrate to a pattern,
    wherein the one or more verified results are generated based on a comparison of one or more monitored results of the first substrate with one or more design parameters, and wherein the one or more monitored results are generated based on at least one of a pattern size measurement and a pattern shift measurement.

11. The medium of claim 10, wherein generating training data comprises using a deep neural network to analyze the one or more verified results.

12. The medium of claim 10, wherein the first substrate and the second substrate are processed by a scanner, a development tool, an etching tool, and an ash tool.

13. The system of claim 1, wherein the exposure recipe is determined based on the one or more monitored results.

14. The method of claim 5, wherein the exposure recipe is determined based on the one or more monitored results.

15. The medium of claim 10, wherein the exposure recipe is determined based on the one or more monitored results.

16. The medium of claim 10, wherein generating training data is further based on the exposure recipe, and/or wherein the exposure recipe comprises a high density focus map.

17. The system of claim 1, wherein the exposure recipe for the second substrate is determined based on the one or more verified results of the inspection of the first substrate.

* * * * *